US009910473B2

(12) United States Patent
Nguyen et al.

(10) Patent No.: US 9,910,473 B2
(45) Date of Patent: Mar. 6, 2018

(54) POWER MANAGEMENT FOR A MEMORY DEVICE

(71) Applicant: Silicon Storage Technology, Inc., San Jose, CA (US)

(72) Inventors: Hung Quoc Nguyen, Fremont, CA (US); Hieu Van Tran, San Jose, CA (US); Hung Thanh Nguyen, Santa Clara, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 415 days.

(21) Appl. No.: 13/830,246

(22) Filed: Mar. 14, 2013

(65) Prior Publication Data

US 2014/0281611 A1    Sep. 18, 2014

(51) Int. Cl.

| G06F 1/32 | (2006.01) |
| G06F 1/16 | (2006.01) |
| G11C 5/14 | (2006.01) |
| G11C 7/08 | (2006.01) |
| G11C 7/10 | (2006.01) |
| G11C 7/20 | (2006.01) |
| G11C 7/22 | (2006.01) |

(52) U.S. Cl.
CPC .................. G06F 1/32 (2013.01); G11C 5/14 (2013.01); G11C 7/08 (2013.01); G11C 7/1072 (2013.01); G11C 7/20 (2013.01); G11C 7/222 (2013.01); *G11C 2207/065* (2013.01); *G11C 2207/2227* (2013.01)

(58) Field of Classification Search
None
See application file for complete search history.

(56) References Cited

U.S. PATENT DOCUMENTS

| 6,239,635 B1 * | 5/2001 | Matsuzaki | 327/160 |
| 6,388,924 B1 | 5/2002 | Nasu | |
| 6,728,827 B2 | 4/2004 | Yamauchi | |
| 6,826,702 B1 * | 11/2004 | Shibuya | 713/320 |
| 7,149,909 B2 | 12/2006 | Cui | |
| 8,612,794 B2 * | 12/2013 | Kojima | 713/501 |
| 2007/0133340 A1 | 6/2007 | Lambrache | |
| 2007/0266268 A1 * | 11/2007 | Abbo et al. | 713/322 |
| 2008/0001677 A1 * | 1/2008 | Shaked et al. | 331/44 |
| 2012/0275256 A1 | 11/2012 | Furutani | |
| 2014/0281611 A1 * | 9/2014 | Nguyen et al. | 713/322 |

FOREIGN PATENT DOCUMENTS

| CN | 1244280 A | 2/2000 |
| CN | 1471170 A | 1/2004 |
| CN | 1886796 A | 12/2006 |
| JP | H10-209284 A | 8/1998 |
| JP | H11-25686 A | 1/1999 |
| JP | 2002-175689 A | 6/2002 |
| WO | 9813742 A1 | 4/1998 |
| WO | 03036722 A1 | 5/2003 |

OTHER PUBLICATIONS

PCT Search Report and Written Opinion dated Apr. 17, 2014 corresponding to the related PCT Patent Application No. US14/011722.

* cited by examiner

*Primary Examiner* — Tanh Nguyen

(74) *Attorney, Agent, or Firm* — Brent Yamashita; DLA Piper LLP US

(57) ABSTRACT

An improved method and apparatus for performing power management in a memory device is disclosed.

4 Claims, 2 Drawing Sheets

POWER MANAGEMENT FOR A MEMORY DEVICE

TECHNICAL FIELD

An improved method and apparatus for performing power management in a memory device is disclosed.

BACKGROUND OF THE INVENTION

Power management techniques for electronic systems are becoming increasingly important. Memory devices, such as flash memory devices and DRAM devices, consume a significant portion of the overall power consumed by various electronic systems. In the prior art, most power management techniques for memory devices involved changing the frequency of one or more clocks received or used by the memory device. In general, decreasing a clock frequency generally will result in less power consumption.

However, certain portions of a memory device, such as a sense amplifier used to read data from a memory array, will consume the same level of power regardless of any changes in clock speed. This is inefficient because prior art sense amplifiers often are designed to achieve the highest performance possible at the highest possible clock speed. In instances where a lower clock frequency is used, as might be the case in a prior art power saving mode, the sense amplifier will be operating at an unnecessarily high performance level.

What is needed is an improved method and apparatus for performing power management in a memory device where the incoming clock frequency is detected and the memory device's operation and power consumption is altered based on the clock frequency.

SUMMARY OF THE INVENTION

The aforementioned problems and needs are addressed through an embodiment for power management. Specifically, the incoming clock frequency is determined, and thereafter, the memory device is placed in a power mode based on the clock frequency. The power state is used to modulate the bias voltage level of a sense amplifier within the memory device. This results in additional power savings.

DETAILED DESCRIPTION OF THE PREFERRED EMBODIMENTS

Figure 1:
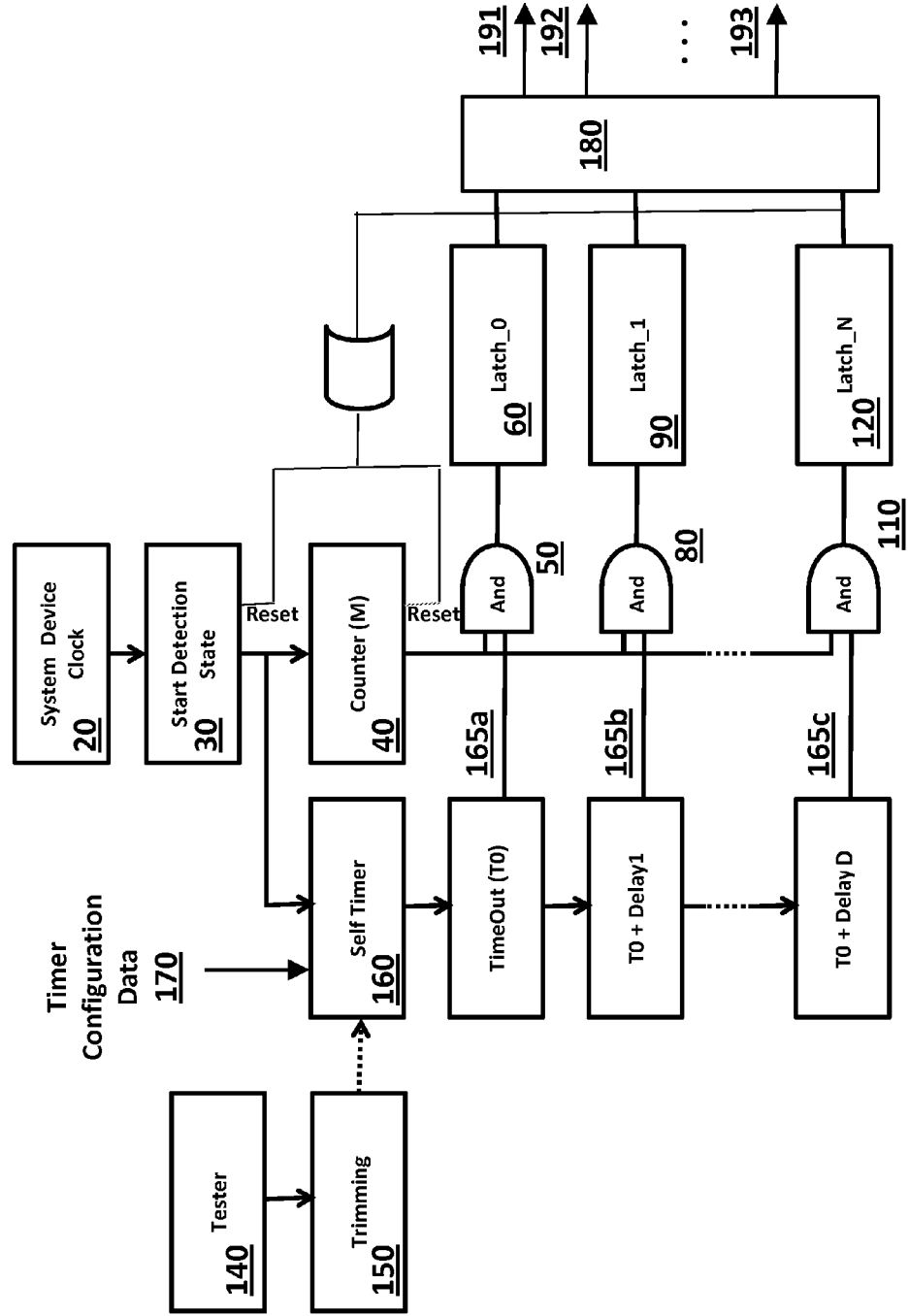
FIG. 1 depicts an embodiment for detecting the frequency of a system device clock and setting a power level in response to the frequency.

An embodiment will now be described with reference to FIG. 1. Power management circuit 10 receives a clock signal from system device clock 20. Power management circuit 10 comprises a detection circuit 30 that receives the clock signal from system device clock 20 and can initiate a detection mode by resetting self timer 160 and counter 40. Counter 40 is configured to count the number of clock cycles within the clock signal received from system device clock 20.

Self timer 160 is a timer. The timer 160 can be trimmed by a trimming circuit 150 such as to compensate for process, voltage, and temperature, or design specification. Self timer 160 can be configured by timer configuration data 170 to assert output signal 165a, 165b, and 165c when a certain time interval is reached after the detection mode is entered (such as after detection circuit 30 resets counter 40 and self timer 160). For example, self timer 160 can be configured by timer configuration data 170 to assert output signal 165a when time interval T0 is reached. In the alternative, self timer 160 can be configured by timer configuration data 170 to assert output signal 165b when time interval (T0+Delay1) is reached. One of ordinary skill in the art will understand that self timer 160 can be configured by timer configuration data 170 such that output signal 165a, 165b, and 165c is asserted when any desired time interval is reached.

Assuming that self timer 160 has been configured by timer configuration data 170 to assert output signal 165a when a time interval of T0 is reached, counter 40 can be used to count the number of clock pulses received during time interval T0. Specifically, output signal 165a-c is input to exemplary AND gates 50, 80, and 110. The output of counter 40 also can be input to exemplary AND gates 50, 80, and 110.

For example, the least significant bit of the output of counter 40 can be input to AND gate 50, the second least significant bit of the output of counter 40 can be input to AND gate 80, and the most significant bit of the output of counter 40 can be input to AND gate 110. The output of AND gate 50 is input to latch 60, the output of AND gate 80 is input to latch 90, and the output of AND gate 110 is input to latch 120. It will be understood by one of ordinary skill in the art that any desired numbers of time intervals can be used through the configuration of self timer 160 by timer configuration data 170 and that "N" sets of AND gates and latches can be used, where N can be any integer.

One of ordinary skill in the art will understand that if output signal 165a, 165b, and 165c of self timer 160 is not yet asserted, the outputs of all of the AND gates (such as AND gate 50, AND gate 80, and AND gate 110) will be "0" (since one output to each AND gate will be "0."). As soon as output signal 165a, 165b, and 165c is asserted, then the output of the various AND gates will constitute the count value of counter 40 at that moment in time. In this manner, the system is able to count the number of clock pulses of system device clock 20 for a given time interval (such as T0), and this measurement is a reflection of the frequency of system device clock 20.

In the situation where N=3, the relationship between the output of counter 40 and the inputs to the AND gates after output signal 165a, 165b, and 165c of self timer 160 is asserted is shown in Table 1:

TABLE 1

| Output of Counter 40 | Input to AND gate 50 | Input to AND gate 80 | Input to AND gate 110 |
|---|---|---|---|
| 000 | 0 | 0 | 0 |
| 001 | 1 | 0 | 0 |
| 010 | 0 | 1 | 0 |
| 011 | 1 | 1 | 0 |
| 100 | 0 | 0 | 1 |
| 101 | 1 | 0 | 1 |
| 110 | 0 | 1 | 1 |
| 111 | 1 | 1 | 1 |

The output of each AND gate and each latch will be the same as the input to each AND gate from counter 40 (since the other input to each AND gate will be "1" since the time interval has been reached). The output of latches 60, 90, and 120 represent the frequency of system device clock 20, and they can be understood to correspond to different desired power levels.

Optionally, latches 60, 90, and 120 are input to combinatorial logic 180, and the output of combinatorial logic 180 comprises Power_Level_1 signal 191, Power_Level_2 signal 192, and Power_Level_$2^N$ signal 193 (and any other Power_Level signals that exist if N>3). In the situation where N=3, the relationship between the values of latches 60, 90, and 120 and the various Power Levels can be as shown in Table 2:

| Output of Latch 120 | Output of Latch 90 | Output of Latch 60 | Asserted Power Level |
|---|---|---|---|
| 0 | 0 | 0 | Power_Level_1 |
| 0 | 0 | 1 | Power_Level_2 |
| 0 | 1 | 0 | Power_Level_3 |
| 0 | 1 | 1 | Power_Level_4 |
| 1 | 0 | 0 | Power_Level_5 |
| 1 | 0 | 1 | Power_Level_6 |
| 1 | 1 | 0 | Power_Level_7 |
| 1 | 1 | 1 | Power_Level_8 |

In the example of Table 2, there is a different power level for each possible frequency detected within time interval T0. This is an illustrative example only, and one of ordinary skill in the art will understand that the threshold points corresponding to each different Power_Level can be set as desired through the design of combinatorial logic 180.

Figure 2:
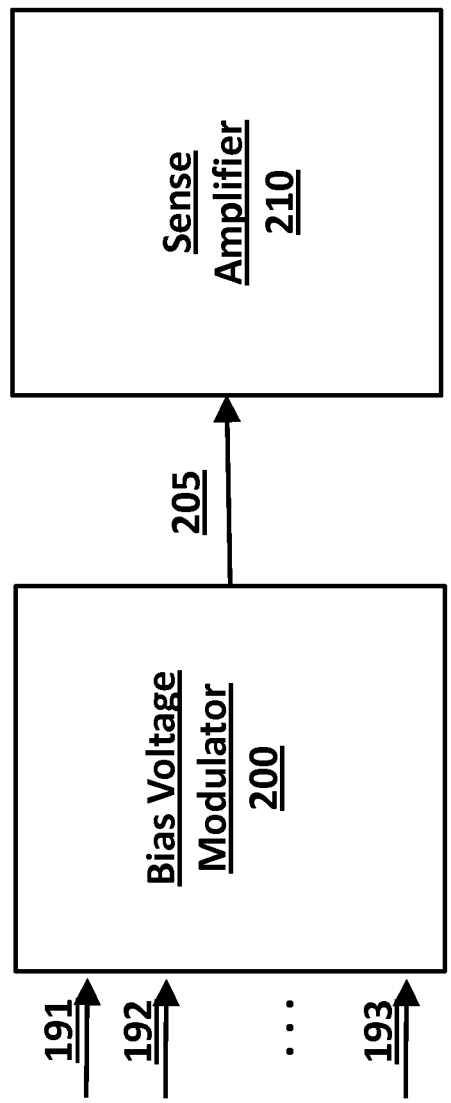
FIG. 2 depicts an embodiment for altering the bias voltage of a sense amplifier in response to a power level of the system.

With reference now to FIG. 2, once a Power_Level is determined, the bias voltage of the sense amplifier of the memory device can be modulated accordingly. Power_Level_1 signal 191, Power_Level_2 signal 192, and Power_Level_$2^N$ signal 193 (and any other Power_Level signals between Power_Level_2 and Power_Level_$2^N$) are input into bias voltage modulator 200, which in turn provides bias voltage 205 to sense amplifier 210. Alternatively, other operational bias circuits can be controlled in this manner by the bias voltage modulator 200.

Bias voltage 205 varies based on the current Power_Level. For example, if Power_Level_1 is asserted (which corresponds to a relatively low output of counter 40 and therefore a relatively low frequency of system device clock 20), then bias voltage 205 will be modulated to a relatively low level. In this manner, power management is achieved through changes to the bias voltage, which in turn affects the power consumption of the sense amplifier.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A power management circuit for use in a memory device, comprising:
    a system device clock for generating a clock signal;
    a timing circuit comprising a plurality of timing stages, wherein each of the plurality of timing stages generates a time period output indicating the completion of a time period, each of the time periods for the plurality of timing stages being different from one another;
    a counter for generating a plurality of count bits indicating a number of clock pulses counted in the clock signal;
    a plurality of logic gates, each of the logic gates receiving a time period output from one of the plurality of timing stages and one of the plurality of count bits from the counter and generating a gate output;
    combinatorial logic for receiving a gate output from each of the plurality of logic gates and outputting a power signal indicating a power level, wherein the power level is proportional to the frequency of the clock signal;
    a bias voltage modulator for providing a bias voltage to a sense amplifier in response to the power signal.

2. The power management circuit of claim 1, wherein the bias voltage modulator alters the bias voltage of the sense amplifier in response to changes in the power signal.

3. A power management method for a memory device, comprising:
    generating, by a system device clock, a clock signal;
    generating, by a plurality of timing stages, a plurality of time period outputs, each time period output indicating the completion of a different time period;
    generating, by a counter, a plurality of count bits indicating the number of clock pulses within the clock signal;
    generating, by a plurality of logic gates, a plurality of gate outputs, wherein each of the plurality of logic gates receives a time period output and a count bit and generates a gate output;
    outputting, by combinatorial logic, a power signal indicating a power level in response to the plurality of gate outputs, wherein the power level is proportional to the frequency of the clock signal; and
    providing, by a bias voltage modulator, a bias voltage to a sense amplifier in response to the power signal.

4. The method of claim 3, wherein the bias voltage modulator alters the bias voltage of the sense amplifier in response to changes in the power signal.

* * * * *